(12) United States Patent
Touya et al.

(10) Patent No.: US 9,373,424 B2
(45) Date of Patent: Jun. 21, 2016

(54) ELECTRON BEAM WRITING APPARATUS AND ELECTRON BEAM WRITING METHOD

(71) Applicant: NuFlare Technology, Inc., Numazu-shi (JP)

(72) Inventors: Takanao Touya, Kanagawa (JP); Takahito Nakayama, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/768,258

(22) Filed: Feb. 15, 2013

(65) Prior Publication Data

US 2013/0216953 A1    Aug. 22, 2013

(30) Foreign Application Priority Data

Feb. 16, 2012    (JP) .................................. 2012-032136

(51) Int. Cl.
*H01J 37/09* (2006.01)
*H01J 37/12* (2006.01)
*H01J 37/317* (2006.01)
*G21K 5/08* (2006.01)
*B82Y 10/00* (2011.01)
*B82Y 40/00* (2011.01)

(52) U.S. Cl.
CPC . *G21K 5/08* (2013.01); *B82Y 10/00* (2013.01); *B82Y 40/00* (2013.01); *H01J 37/09* (2013.01); *H01J 37/12* (2013.01); *H01J 37/3174* (2013.01)

(58) Field of Classification Search
CPC ........ H01J 37/09; H01J 37/12; H01J 37/3174
See application file for complete search history.

(56) References Cited

U.S. PATENT DOCUMENTS

| 4,683,366 | A | * | 7/1987 | Harte et al. | ............... 219/121.25 |
| 5,254,856 | A | * | 10/1993 | Matsui et al. | ..................... 850/9 |
| 5,760,410 | A | | 6/1998 | Matsuki et al. | |

(Continued)

FOREIGN PATENT DOCUMENTS

| CN | 1973350 A | 5/2007 |
| CN | 101243531 A | 8/2008 |

(Continued)

OTHER PUBLICATIONS

Office Action issued Dec. 17, 2013 in Korean Patent Application No. 10-2013-0015714 (with English translation).

(Continued)

*Primary Examiner* — Robert Kim
*Assistant Examiner* — Sean Luck
(74) *Attorney, Agent, or Firm* — Oblon, McClelland, Maier & Neustadt, L.L.P.

(57) ABSTRACT

An electron beam writing apparatus comprising a stage that a sample is placed on, an electron optical column, an electron gun emitting an electron beam disposed in the optical column, an electrostatic lens provided with electrodes aligned in an axial direction of the electron beam disposed in the optical column, and a voltage supply device for applying positive voltage constantly to the electrostatic lens. A shield plate is disposed between the XY stage and the electron optical column to block reflected electrons or secondary electrons generated by irradiation to the sample with the electron beam. The electrostatic lens is disposed immediately above the shield plate to change a focal position of the electron beam. A voltage supply device applies a positive voltage constantly to the electrostatic lens.

9 Claims, 5 Drawing Sheets

(56) References Cited

U.S. PATENT DOCUMENTS

| | | | |
|---|---|---|---|
| 6,847,038 B2 | 1/2005 | Todokoro et al. | |
| 6,855,938 B2 | 2/2005 | Preikszas et al. | |
| 7,235,799 B2 | 6/2007 | Nakasuji et al. | |
| 7,485,879 B2 | 2/2009 | Sunaoshi et al. | |
| 7,554,107 B2 | 6/2009 | Yoshitake et al. | |
| 7,643,130 B2 | 1/2010 | Yoshitake et al. | |
| 7,679,068 B2 | 3/2010 | Kamikubo et al. | |
| 7,700,931 B2 * | 4/2010 | Shichi et al. | 250/492.21 |
| 7,800,084 B2 | 9/2010 | Tamamushi | |
| 7,834,333 B2 | 11/2010 | Nishimura et al. | |
| 8,067,753 B2 | 11/2011 | Touya | |
| 8,183,544 B2 | 5/2012 | Tsuruta et al. | |
| 8,188,443 B2 | 5/2012 | Ohtoshi et al. | |
| 8,207,514 B2 | 6/2012 | Hara et al. | |
| 8,229,207 B2 | 7/2012 | Tamamushi | |
| 8,277,603 B2 | 10/2012 | Tamamushi et al. | |
| 8,306,310 B2 | 11/2012 | Tamamushi | |
| 2003/0116721 A1 * | 6/2003 | Ito | 250/492.2 |
| 2004/0108458 A1 * | 6/2004 | Gerlach et al. | 250/311 |
| 2008/0277584 A1 * | 11/2008 | Kim | 250/311 |
| 2009/0206258 A1 * | 8/2009 | Kasai et al. | 250/311 |
| 2009/0242807 A1 * | 10/2009 | Tsuruta et al. | 250/492.2 |
| 2010/0102227 A1 | 4/2010 | Chen et al. | |
| 2010/0187433 A1 * | 7/2010 | Eastham | 250/396 R |
| 2010/0187436 A1 * | 7/2010 | Frosien et al. | 250/424 |
| 2011/0068281 A1 | 3/2011 | Hara et al. | |
| 2011/0231134 A1 * | 9/2011 | Yoshitake | 702/94 |
| 2011/0255770 A1 | 10/2011 | Touya et al. | |
| 2012/0061583 A1 | 3/2012 | Wieland et al. | |
| 2012/0193553 A1 | 8/2012 | Touya | |
| 2013/0010291 A1 | 1/2013 | Tamamushi | |
| 2013/0056645 A1 | 3/2013 | Yoshikawa et al. | |
| 2013/0056647 A1 | 3/2013 | Yoshikawa et al. | |
| 2013/0082187 A1 | 4/2013 | Ogasawara | |

FOREIGN PATENT DOCUMENTS

| | | |
|---|---|---|
| CN | 102017053 A | 4/2011 |
| CN | 102023492 A | 4/2011 |
| JP | 9-293670 | 11/1997 |
| JP | 4619765 B2 | 1/2011 |
| TW | 201021077 A1 | 6/2010 |
| TW | 201133539 A1 | 10/2011 |
| WO | WO 2006/004374 A1 | 1/2006 |
| WO | WO 2007/021162 A1 | 2/2007 |
| WO | WO 2009/106560 A1 | 9/2009 |

OTHER PUBLICATIONS

U.S. Appl. No. 13/706,908, filed Dec. 6, 2012, Yoshikawa, et al.
U.S. Appl. No. 13/763,976, filed Feb. 11, 2013, Touya, et al.
U.S. Appl. No. 13/768,327, filed Feb. 15, 2013, Touya, et al.
Combined Chinese Office Action and Search Report issued Jul. 11, 2014 in Patent Application No. 201310047452.0 (with English language translation).
U.S. Appl. No. 14/108,936, filed Dec. 17, 2013, Touya, et al.
U.S. Appl. No. 14/108,844, filed Dec. 17, 2013, Touya, et al.
Combined Office Action and Search Report issued Dec. 9, 2014 in Taiwanese Patent Application No. 102100695 (with English language translation).

* cited by examiner

ELECTRON BEAM WRITING APPARATUS AND ELECTRON BEAM WRITING METHOD

CROSS-REFERENCE TO THE RELATED APPLICATION

The entire disclosure of the Japanese Patent Application No. 2012-032136, filed on Feb. 16, 2012 including specification, claims, drawings, and summary, on which the Convention priority of the present application is based, are incorporated herein in its entirety.

FIELD OF THE INVENTION

The present invention relates to an apparatus and method for writing patterns with electron beams.

BACKGROUND

The tendency in recent years towards higher mounting densities and larger capacities of large-scale integrated (LSI: Large Scale Integration) circuits are further reducing the circuit line widths needed for semiconductor devices.

Fabrication of semiconductor devices involves the use of photomasks or reticles (hereinafter, referred to collectively as masks) each having circuit patterns formed thereon. The circuit patterns on a mask are photolithographically transferred on to a wafer using a reduction projection exposure apparatus, often called a stepper, whereby the circuit patterns are formed on the wafer. An electron beam writing apparatus capable of writing fine patterns is used to manufacture the masks used to transfer the fine circuit patterns onto the wafer. This electron beam writing apparatus has inherently superior resolution, and can ensure greater depth of focus, thus allowing control over size fluctuations even with a difference in level.

Japanese Laid-Open Patent Publication No. Hei 9-293670 (1997) discloses a variable shape electron beam writing apparatus used for electron beam lithography. The pattern writing data for such apparatus is prepared by using design data (CAD data) of a semiconductor integrated circuit, for example, CAD data processed by a CAD system, wherein the CAD system divides the pattern.

For example, the pattern is divided into segments each the size of the maximum shot size, which is defined by the size of the electron beam. After this division of the pattern, the apparatus sets the coordinate positions and size of each shot and the radiation time. Pattern writing data is then produced which is used to shape the shot in accordance with the shape and size of the pattern or pattern segment to be written. The pattern writing data is divided corresponding to a strip-shaped frame (or main deflection region), and each frame is divided into sub-deflection regions. That is, the pattern writing data for the entire wafer has a hierarchical data structure in which data of each of a plurality of strip-shaped frames, which correspond to the main reflection regions, is divided into a plurality of data each representing one of the plurality of sub-reflection regions (smaller in size than the main deflection regions) in the frame.

The electron beam is scanned over each sub-deflection region by the sub-deflector at higher speed than it is scanned over each main deflection region; the sub-deflection regions are generally the smallest writing fields. When writing on each sub-deflection region, the shaping deflector forms a shot of a size and shape corresponding to the pattern or pattern segment to be written. Specifically, the electron beam emitted from the electron gun is shaped into a rectangular shape by a first aperture and then projected to a second aperture by the shaping deflector, resulting in a change in the shape and size of the beam. The electron beam is focused by an objective lens, then deflected by the sub-deflector and the main deflector and irradiated onto the mask mounted on the stage.

Furthermore, when a mask is irradiated with an electron beam, electrons reflected on the mask (reflected electrons) or electrons generated after entering the mask (secondary electron) proceed upward within an electron optical column.

FIG. 3 is a simulation of a path of reflected electrons having an energy value of 50 keV. Here, the simulation is performed only in a single direction in relation to each of exit angles of 10°, 30°, 50°, 70°, and 90°.

FIG. 4 is a simulation of a path of secondary electrons having an energy value of 100 eV. The simulation is performed only in a single direction in relation to each of exit angles of 10°, 30°, 50°, 70°, and 90°.

It should be noted that in FIGS. 3 and 4, the horizontal axis represents an x-axis, namely, a direction perpendicular to an electron beam axis. In addition, the vertical axis represents a Z-axis, namely, a direction parallel to the electron beam axis. Furthermore, an electromagnetic type lens, namely, a lens that generates a magnetic field by causing electric current to flow in a coil is used as an objective lens.

As can be seen from the simulation results shown in FIGS. 3 and 4, the reflected electrons or the secondary electrons perform a helical motion, coiling around the electron beam axis. Accordingly, the electron beam drifts under the influence of the reflected electrons or the secondary electrons, which results in irradiation to a position deviated from a target position.

The present invention has been made in view of the above problems. It is, therefore, an object of the present invention to provide an electron beam writing apparatus and an electron beam writing method capable of reducing the electron beam drift due to the reflected electrons or the secondary electrons.

Other challenges and advantages of the present invention are apparent from the following description.

SUMMARY OF THE INVENTION

According to one aspect of the present invention, an electron beam writing apparatus comprising a control unit and a writing unit having an electron optical column and a writing chamber, comprising; a stage on which a sample is placed in the writing unit, an electron gun unit, which is disposed in the electron optical column, configured to emit an electron beam, and an electrostatic lens aligned in an axial direction of the electron beam in the electron optical column supplied with positive voltage, from a voltage supply device, constantly during writing patterns on the sample.

According to another aspect of the present invention, an electron beam writing apparatus wherein a positive voltage in a range between 0 V and 250 V is applied from the voltage supply device to the electrostatic lens.

According to another aspect of the present invention, an electron beam writing apparatus wherein a positive voltage between 100 V and 200 V on average is applied from the voltage supply device to the electrostatic lens.

According to another aspect of the present invention, an electron beam writing apparatus comprising a shield plate disposed between the stage and the electron optical column to block reflected electrons or secondary electrons generated by irradiation to the sample with the electron beam.

According to another aspect of the present invention, an electron beam writing apparatus wherein the electrostatic lens is disposed immediately above the shield plate to change a focal position of the electron beam.

According to another aspect of the present invention, an electron beam writing apparatus further comprising, a first aperture for shaping the electron beam emitted from the electron gun, a second aperture further shaping the electron beam that has passed through the first aperture, an illumination lens illuminating the first aperture with the electron beam, a projection lens projecting the electron beam to the second aperture having passed through the first aperture, and an objective lens focusing the electron beam that has passed through the second aperture, wherein the illumination lens, the projection lens, and the objective lens are all electromagnetic type lenses, and the electrostatic lens is disposed between the objective lens and the shield plate.

According to another aspect of the present invention, an electron beam writing method in which a predetermined pattern is written on a sample placed on a stage by emitting an electron beam from an electron gun disposed in an electron optical column, wherein a positive voltage is constantly applied to an electrostatic lens having electrodes aligned in an axial direction of the electron beam.

According to another aspect of the present invention, an electron beam writing method wherein a shield plate is disposed between the stage and the electron optical column to block reflected electrons or secondary electrons generated by irradiation to the sample with the electron beam, disposing the electrostatic lens immediately above the shield plate to change a focal position of the electron beam.

According to another aspect of the present invention, an electron beam writing method wherein the electron beam that has been emitted from the electron gun to a first aperture is illuminated by a illumination lens, projecting the electron beam that has passed through the first aperture to a second aperture by a projection lens, focusing the electron beam that has passed through the second aperture by an objective lens, and irradiating the electron beam that has passed through the objective lens on the sample through the electrostatic lens.

According to another aspect of the present invention, an electron beam writing method wherein a positive voltage in a range between 0 V and 250 V is applied to the electrostatic lens.

According to another aspect of the present invention, an electron beam writing method wherein a positive voltage between 100 V and 200 V on average is applied to the electrostatic lens.

DETAILED DESCRIPTION OF THE EMBODIMENTS

Figure 1:
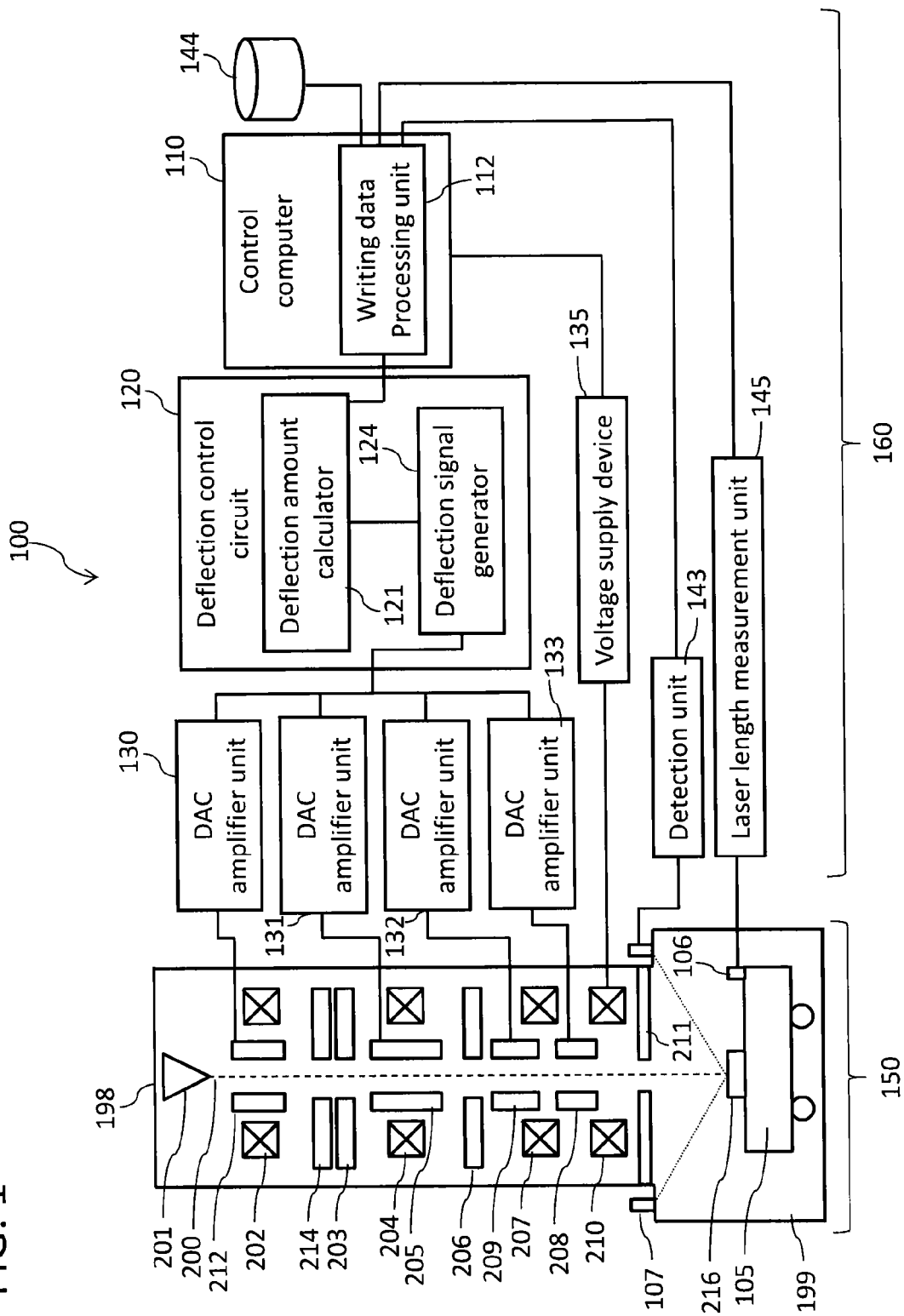
FIG. 1 is a block diagram of an electron beam writing apparatus according to an embodiment of the present invention.

FIG. 1 is a schematic diagram of an electron beam writing apparatus according to an embodiment of the present invention.

The electron beam writing apparatus 100 consisting of a writing unit 150 and a control unit 160, is one example of a variable shape electron beam writing apparatus.

The writing unit 150 includes an electron optical column 198 and a writing chamber 199.

The electron optical column 198 includes an electron gun 201, an illumination lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209 and an electrostatic lens 210.

The illumination lens 202, the projection lens 204, the objective lens 207, and the electrostatic lens 210 are all lenses for adjusting an imaging position of an electron beam 200. These lenses are aligned in an axial direction of the electron beam 200, as shown in FIG. 1. In the present embodiment, the illumination lens 202, the projection lens 204, and the objective lens 207 are all electromagnetic type lenses. On the other hand, the electrostatic lens 210 has electrodes (not shown) aligned in the axial direction of the electron beam 200, and can control a focal position of the electron beam 200 according to voltage applied between the electrodes.

To control the focal position of the electron beam 200 efficiently, the electrostatic lens 210 must be disposed within a magnetic field. In an electron beam writing apparatus having a deflector disposed within a magnetic field, the deflector can double as an electrostatic lens. On the other hand, in the present invention, in the electron optical column 198, the magnetic field is directed down the deflector, the electrostatic lens 210 is located below the deflector, specifically, below the main deflector 208. This is one of the features that make the electron beam writing apparatus of the present invention different from a conventional one.

Figure 5:
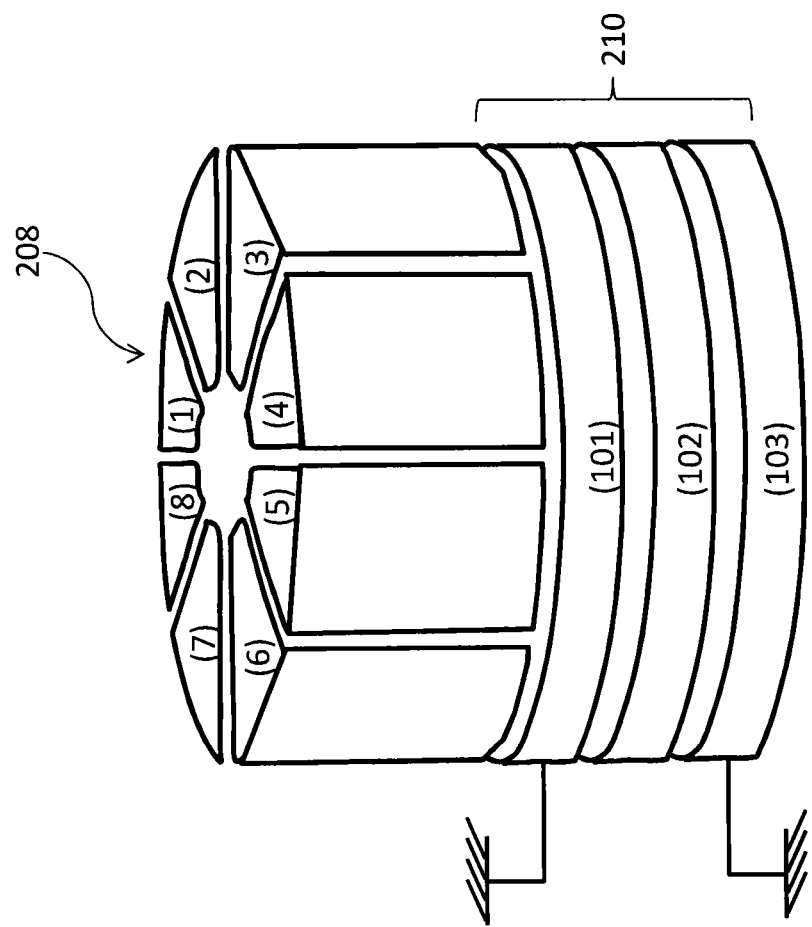
FIG. 5 is a schematic diagram of construction and arrangement of an electrostatic lens.

FIG. 5 is a schematic diagram showing the construction and arrangement of an electrostatic lens 210. As shown in FIG. 5, the electrostatic lens 210 is arranged below the main deflector 208.

The main deflector 208 is an electrostatic deflector composed of the eight electrodes. The main deflector 208 deflects the electron beam to a predetermined sub-reflection region. For example, in order to deflect the electron beam to a predetermined X direction and Y direction, the DAC amplifier unit 133 in FIG. 1 supplies a voltage "y" to the electrode (1), a voltage "(x+y)/$\sqrt{2}$" to the electrode (2), a voltage "x" to the electrode (3), a voltage "(x−y)/$\sqrt{2}$" to the electrode (4), a voltage "−y" to the electrode (5), a voltage "(−x−y)/$\sqrt{2}$" to the electrode (6), a voltage "−x" to the electrode (7), and a voltage "(−x+y)/$\sqrt{2}$" to the electrode (8). This makes it possible to deflect the electron beam in a predetermined direction. It should be noted that the DAC amplifier unit 133, in the example shown in FIG. 5, is composed of a plurality of amplifiers, which are provided to each of the eight electrodes of an electrostatic deflector. In addition, a voltage required to deflect the electron beam is 250 V, for example.

In FIG. 5, the electrostatic lens 210 has three electrodes aligned in a vertical direction (namely, the axial direction of the electron beam 200 in FIG. 1). Of these, a middle electrode (102) is a lens electrode, held between grounding electrodes (101) and (103). The grounding electrodes (101 and 103) function to stop the spread of an electric field, generated as a result of positive voltage applied to the middle electrode (102), into an area outside of the grounding electrodes (101 and 103). The focal position of the electron beam 200 is controlled according to the voltage applied between these electrodes. In the present embodiment, as described later, positive voltage is always applied to the middle electrode (102) of the electrostatic lens 210 by a voltage supply device 135, as shown in FIG. 1. It should be noted that a control computer 110, as shown in FIG. 1, controls the operation of the voltage supply device 135.

The illumination lens 202 illuminates the electron beam 200 emitted from the electron gun 201 to the first shaping aperture 203, whereby the electron beam 200 is shaped into, for example, a rectangular form. The electron beam 200 is then projected on the second shaping aperture 206 by the projection lens 204. The position of the image of the first shaping aperture on the second shaping aperture 206 is controlled by the shaping deflector 205. Thereby the shape and size of the electron beam 200 is changed. The electron beam 200 passing through the second shaping aperture 206 is focused by the objective lens 207, and then deflected by the main deflector 208 and the sub-deflector 209. The electrostatic lens 210 then corrects the focal position, and then a sample 216 placed on the writing chamber 199 is irradiated with the electron beam.

In the present embodiment, as shown in FIG. 1, it is preferred that a shield plate 211 be disposed below the electron optical column 198, specifically, below the electrostatic lens 210. By providing the shield plate 211, the amount of reflected electrons or secondary electrons, which are generated according to the irradiation to the sample 216 with the electron beam 200 and then enter the electron optical column 198 can be reduced.

Figure 3:
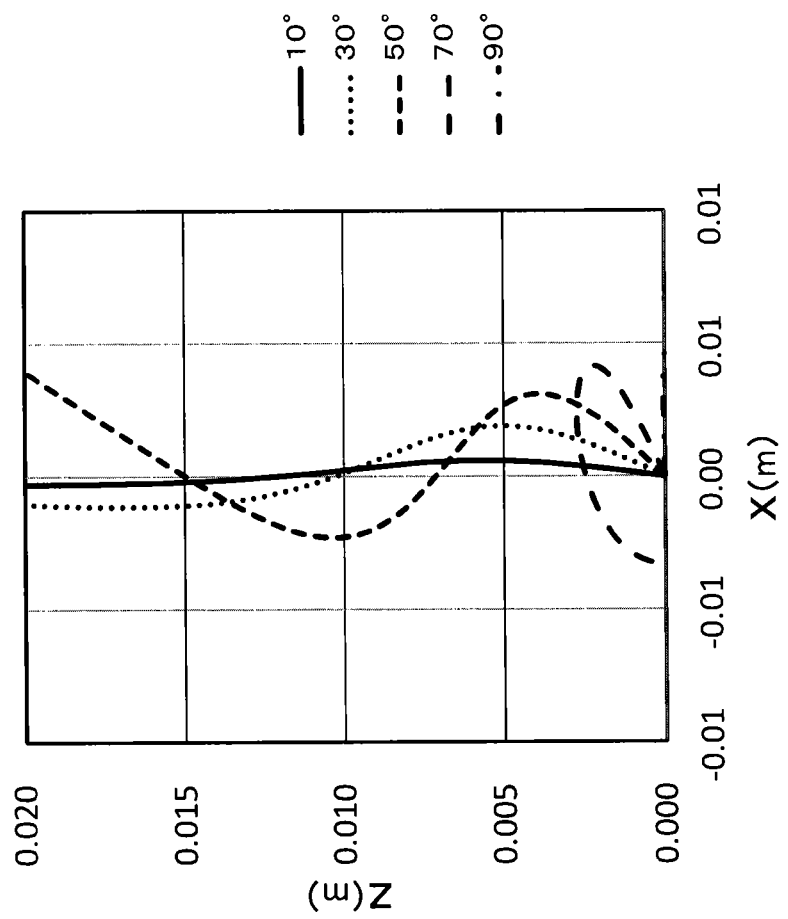
FIG. 3 is a simulation of a path of reflected electrons having an energy value of 50 keV.
Figure 4:
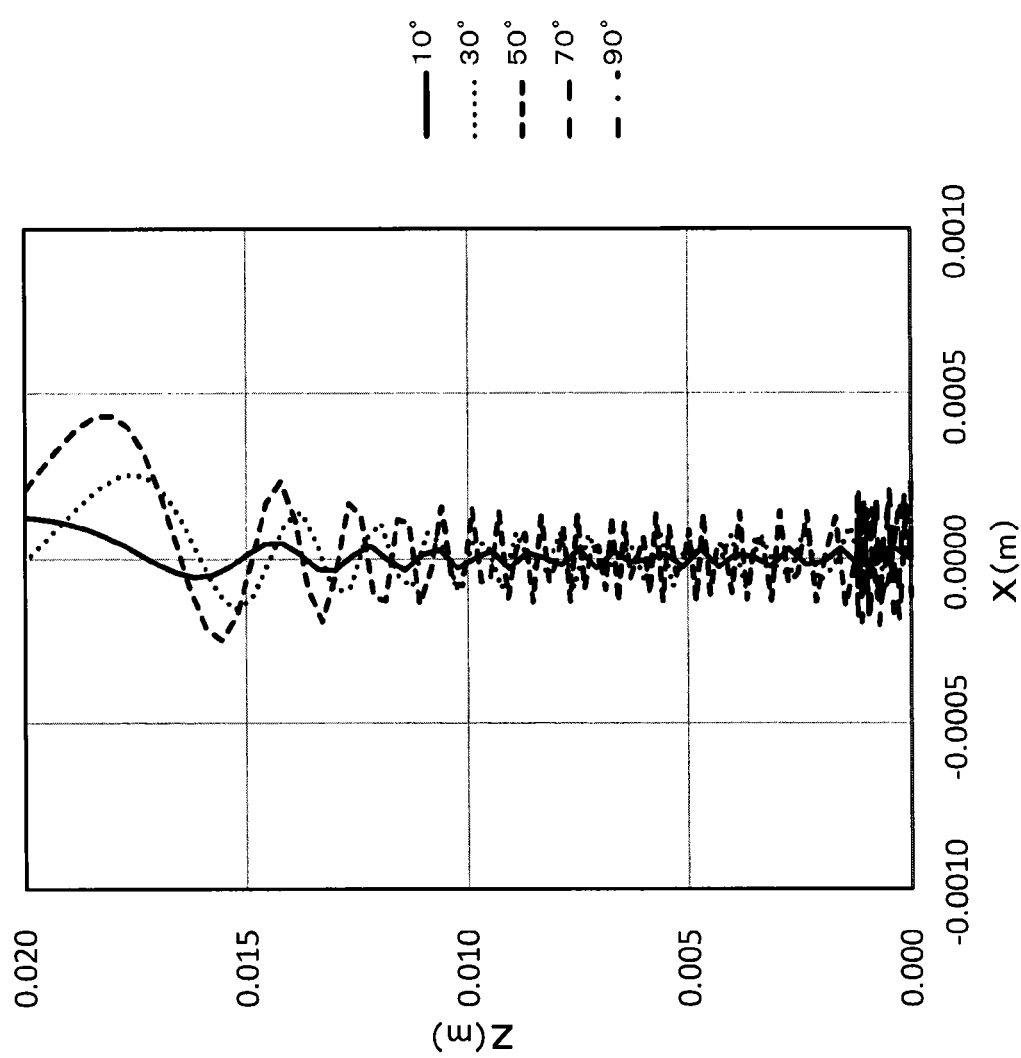
FIG. 4 is a simulation of a path of secondary electrons having an energy value of 100 eV.

As described with reference to FIGS. 3 and 4, however, the reflected electrons or secondary electrons perform a helical motion, coiling around an optical axis of the electron beam 200. Therefore, some of the reflected electrons or the secondary electrons pass through an opening of the shield plate 211, and form an electron cloud within the electron optical column 198. Such an electron cloud causes the path of the electron beam 200 to change, and therefore a target position on the sample 216 is not irradiated with the electron beam 200.

It is thought that the magnetic field within the electron optical column 198 contributes to the formation of the electron cloud. That is, when a negative electric field is formed within the electron optical column 198, a potential difference is generated between energies possessed by the reflected electrons or the secondary electrons, and this potential difference becomes a potential barrier to form an electron cloud. In addition, the reflected electrons or the secondary electrons have low energy and a low transfer rate, and thus easily remain within the electron optical column 198. This is also thought to contribute to the formation of the electron cloud.

Therefore, the present invention prevents the formation of the electron cloud by constantly applying positive voltage to the electrodes constituting the electrostatic lens aligned in the axial direction of the electron beam.

In the present embodiment, positive voltage is constantly applied to the electrodes constituting the lens (specifically, the electrostatic lens 210) disposed above the shield plate 211. Then, the reflected electrons or the secondary electrons passing through the opening of the shield plate 211 and entering the electron optical column 198 are attracted and moved to the electric field formed by the electrostatic lens 210. At this time, since a magnetic lens generating a magnetic field is not disposed above the electrostatic lens 210, the reflected electrons or the secondary electrons are randomly pulled into the electron optical column 198. That is, the electrons are not pulled in and concentrated in a specific location therefore an electron cloud will not be generated. Therefore, according to the present embodiment, a change in the path of the electron beam 200 can be suppressed by preventing the reflected electrons or the secondary electrons from remaining in the electron optical column 198.

For example, in a case where the electrostatic lens 210 is composed of a first electrode disposed on the side of the electron gun 201 and a second electrode disposed on the side of the sample 216, a positive voltage is applied to these electrodes. The applied voltage can be set within a range of 0 V from 250 V, for example, a voltage of 100 V to 200 V can be applied on average. By adjusting the voltage value within such a range the focal position of the electron beam 200 can be changed by up to about 10 µm.

In FIG. 1, a XY stage 105 is arranged in the writing chamber 199.

The sample 216 to be written is mounted on the XY stage 105. When a mask is used as the sample 216, the mask has, for example, a mask substrate consisting of quartz or a similar material, a chromium (Cr) film or a molybdenum silicon (MoSi) film as a light shielding film on the mask substrate, and a resist film on the light shielding film. Next, the resist film is irradiated the electron beam 200 to write a predetermined pattern.

A reflective mirror 106 for measuring the position of the XY stage using a laser is arranged at a different position to the sample 216 positioned on the XY stage 105. The reflective mirror 106 reflects the laser emitted from a laser length measurement unit 145, then the laser length measurement unit 145 receives the laser reflected on the reflective mirror 106. Thereby the position of the XY stage 105 is found. The data of the position is outputted to a writing data processing unit 112 of the control computer 110.

A Z sensor 107 for detecting the position of the sample 216 along the height direction (Z direction) is arranged at the top of the writing chamber 199. The Z sensor 107 consists of a combination of a light emitting unit and a light receiving unit. The light emitted from the light emitting unit is reflected on the surface of the sample 216, the light reflected is then received by the light receiving unit. Thereby the height of the sample 216 is measured. The height data detected by the Z sensor 107 is sent to a detection unit 143, and is then converted to digital data, after that, it is outputted to the writing data processing unit 112 of the control computer 110.

The blanking deflector 212 may be replaced with a plurality of electrodes, for example, two or four electrodes. Each of the shaping deflector 205, the main deflector 208 and the sub-deflector 209 may be replaced with a plurality of electrodes, for example, four or eight electrodes. The electrode of each of the deflectors is individually connected to at least one DAC (Digital Analog Converter).

The control unit 160 includes the control computer 110, a deflection control circuit 120, the DAC amplifier units (130 to 133) and a storage device, such as a magnetic disk.

The control computer 110, the deflection control circuit 120 and the storage device 144 are connected to each other through buses (not shown). The deflection control circuit 120 and the DAC amplifier units (130 to 133) are also connected to each other through buses (not shown).

The DAC amplifier unit 130 is connected to the blanking deflector 212. The DAC amplifier unit 131 is connected to the shaping deflector 205. The DAC amplifier unit 132 is connected to the sub-deflector 209. The DAC amplifier unit 133 is connected to the main deflector 208.

The deflection control circuit 120 transmits the digital signals for controlling the DAC amplifier units (130 to 133), respectively. The digital signals are then converted into analog signals. The DAC amplifier units (130 to 133) amplify the converted analog signals and then transmit the amplified analog signals as deflection voltage to the corresponding deflectors, respectively. The electron beam 200 is then deflected to the desired position.

Figure 2:
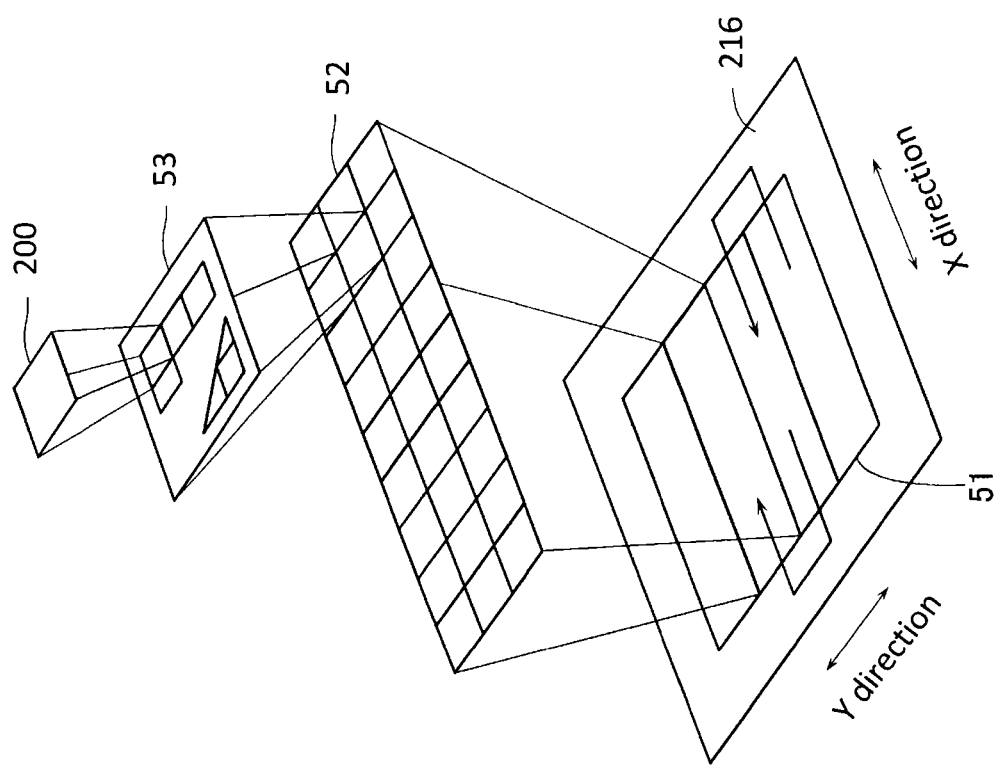
FIG. 2 is an illustrative diagram of writing with electron beams.

FIG. 2 is an illustrative diagram of writing with the electron beam 200.

As shown in FIG. 1 and FIG. 2, patterns 51 to be written on the sample 216 are each divided into rectangular frame regions 52. Writing with an electron beam 200 is repeated for each frame region 52 while the XY stage 105 continuously moves in one direction, for example in the plus or minus X-direction. The frame region 52 is further divided into sub-deflection regions 53, and the electron beam 200 writes only the necessary internal portions of each sub-deflection region 53. The frame region 52 is a rectangular writing region determined by the deflection width of the main deflector 208, and the sub-deflection region 53 is a writing region determined by deflection width of the sub-deflector 209.

The determination of the standard position of the sub-deflection regions 53 is done with the main deflector 208, writing inside the sub-deflection regions 53 is controlled by sub-deflector 209. That is, the electron beam 200 is positioned in the specified sub-deflection regions 53 by the main deflector 208, determining the writing position inside sub-deflection regions 53 by the sub-deflector 209. Furthermore, the shaping deflector 205, and the aperture 203 and 206 for shaping the electron beam determine the shape and size of the electron beam 200. While the XY stage 105 is continuously moved in one direction a pattern is written in the inside of the sub-deflection region 53, and upon completion of the writing, the next sub-deflection region 53 is written. After all internal sub-deflection regions 53 of the frame region 52 have been written, the XY stage 105 is moved in steps in a direction (e.g., the plus or minus Y-direction) that is orthogonal to the continuous moving direction. Similar processing is then repeated for sequential writing of the frame region 52.

The sub-deflection regions 53 are regions which are scanned and written by the electron beam 200, faster than scanning and writing of main deflection regions by sub-deflector 209, sub-deflection regions 53 are usually the smallest writing regions. When writing is performed inside the sub-deflection regions 53, the size and shape of shot are prepared according to the pattern shape, the shaping deflector 205 then forms the desired shot. Specifically, the electron beam 200 is irradiated from the electron gun 201, the first shaping aperture 203 forms the beam into a square shape, the electron beam is then projected to the second shaping aperture 206 by the shaping deflector 205, the 2nd aperture 18 changes the beam shape and size. After that, the electron beam 200 deflected by sub-deflector 209 and main deflector 208, is irradiated to the sample 216 which is mounted on XY stage 105.

When the sample 216 is irradiated with an electron beam 200, electrons reflected on the sample 216 (reflected electrons) or electrons generated after entering the sample 216 (secondary electrons) are generated. The reflected electrons or the secondary electrons perform a helical motion, coiling around the axis of the electron beam 200, and proceed upward within an electron optical column 198. In the present embodiment, since positive electric potential is constantly given to the electrodes that the electrostatic lens 210 is composed of, the reflected electrons or the secondary electrons entering the electron optical column 198 are attracted and moved to the magnetic field formed by the electrostatic lens 210. This prevents the formation of the electron cloud within the electron optical column 198, and thus the electron beam 200 is prevented from drifting, so that a desired position on the sample 216 can be irradiated with the electron beam 200.

Next, a method for writing desired patterns on the sample 216 using the electron beam writing apparatus shown in FIG. 1, is will be described.

In FIG. 1, the control computer 110 is connected to the storage device 144. The control computer 110 includes the writing data processing unit 112.

CAD data prepared by the designer (or user) is converted to design intermediate data in a hierarchical format such as OASIS. The design intermediate data includes data of the pattern formed on the sample 216 created for each layer. It should be noted that, generally, the electron beam writing apparatuses are not adapted to be able to directly read OASIS data. That is, each manufacturer of the electron beam writing apparatus uses different format data. Therefore, OASIS data is converted, for each layer, to format data in a format specific to the electron beam writing apparatus used, and this format data is input to the electron beam writing apparatus.

In FIG. 1, format data is entered into the electron beam writing apparatus 100 via the storage device 144.

The designed pattern includes pattern features each consisting of basic features such as rectangles and triangles. The storage device 144 stores feature data indicating the shape, size, and position of each pattern feature, specifically, information such as the coordinates (x, y) of the reference position of each feature, the length of its sides, and a shape code (or identifier) identifying the type of shape such as a rectangle or triangle.

Further, a group of pattern features, defined in an area of approximately a few tens of micrometers square is referred to as a "cluster" or "cell". It is common practice that the design pattern data is defined in a hierarchical structure using clusters or cells. A cluster (or cell), which contains a pattern feature or features, may be used alone or repeated at certain intervals. In the former case the coordinate positions of the cluster (or cell) on the sample 216 are specified, whereas in the latter case the coordinate positions of each copy of the cluster (or cell) are indicated together with a repetition instruction. Each cluster (or cell) is disposed in a strip-shaped region, referred to as a "frame" or "stripe", having a width of a few hundreds of micrometers and a length of approximately 100 mm which corresponds to the length of the sample 216 in the X or Y direction.

The division of the pattern into pattern elements is performed based on the maximum shot size determined by the size of the electron beam 200, and the coordinate positions, size, and exposure time of each divided shot are also set. Then, writing data is generated so that each shot is shaped in accordance with the shape or size of a pattern element to be written. The writing data is divided into strip-like frame regions (main deflection regions), and each of the frame regions is further divided into sub-deflection regions. That is, the writing data of the entire wafer has a hierarchical data structure including the data of a plurality of strip-like frames whose size corresponds to the size of the main deflection region and the data of a plurality of sub-deflection region units, smaller in size than the main deflection region, in the frame.

In FIG. 1, write data which is read from the storage device 144 by the control computer 110, is processed through a plurality of steps in the writing data processing unit 112, thereby generating shot data. The shot data is transmitted to a deflection amount calculator 121 of the deflection control circuit 120.

The deflection amount calculator 121 receives the shot data, the positional information on an XY stage 105, and the height information on the sample 216 sent from the writing data processing unit 112. Then, respective deflection amounts in the blanking deflector 212, the shaping deflector 205, the sub-deflector 209, and the main deflector 208 are calculated by the deflection amount calculator 121. The respective deflection amounts thus obtained are sent to a deflection signal generator 124.

The deflection signal generator 124 generates a deflection signal to be applied to each electrode of the blanking deflector 212, the shaping deflector 205, the sub-deflector 209, and the main deflector 208. Each deflection signal is outputted to each of the corresponding DAC amplifier units 130 to 133.

After the DAC amplifier units 130 to 133 convert deflection signals that are digital signals outputted from the deflection signal generator 124 into analog signals, respectively, they amplify the analog signals to produce deflection voltages. The deflection voltages produced are applied to the corresponding deflectors 212, 205, 209, 208.

The electron beam 200 emitted from the electron gun 201 illuminates the first shaping aperture 203 through the illumination lens 202. This shapes the electron beam 200 into a rectangle, for example. Subsequently, the electron beam 200 is projected to the second shaping aperture 206 by the projection lens 204. The projection position in the second shaping aperture 206 is determined by the deflection voltage applied to the shaping deflector 205.

It should be noted that the blanking aperture 214 and the blanking deflector 212 serve to control irradiation to the sample 216 with the electron beam 200.

The electron beam 200 passing through the second shaping aperture 206 is shaped into the desired shape and size. Next, electron beam 200 passing through the second shaping aperture 206 is focused by the objective lens 207, and then deflected by the main deflector 208 and the sub-deflector 209. That is, the electron beam 200 is deflected to the position corresponding to deflection voltage applied to the main deflector 208 and the sub-deflector 209, respectively. The main deflector 208 positions the electron beam 200 in the sub-deflection region on the sample 216. The sub-deflector 209 positions the electron beam 54 at a writing position in the sub-deflection region.

The electron beam 200, which is deflected by the main deflector 208 and the sub-deflector 209, is focused on the sample 216. In the present embodiment, electric potential of the electrodes that the electrostatic lens 210 is composed of, is constantly positive. That is, positive electric potential is constantly given to the electrostatic lens 210 by the voltage supply device 135 during writing. The control computer 110 controls the voltage supply device 135. For example, a voltage in a range between 0 V between 250 V can be applied from the voltage supply device 135 to the electrostatic lens 210. When the applied voltage is changed, thereby the focal position of the electron beam 200 is changed. In this case, it is preferable that a voltage in a range between 100 V and 200 V on average, for example, is applied to the electrostatic lens 210 considering offset.

As mentioned above, the sample 216 is mounted on the XY stage 105. The shield plate 211 is arranged between the XY stage 105 and the electron optical column 198. The electric potential of the sample 216, the XY stage 105 and the shield plate 211 is 0V, respectively. Therefore if the electric potential of the electrostatic lens 210 is constantly positive, the reflected electrons or the secondary electron generated when the sample 216 is irradiated with the electron beam 200, are attracted and moved to the magnetic field formed by the electrostatic lens 210 to proceed upward within an electron optical column 198. That is, the electrostatic lens 210 forms a positive electric field, thereby the reflected electrons or the secondary electron is accelerated, then it can be prevented that the reflected electrons or the secondary electrons remains within the electron optical column 198. Accordingly, the present invention is capable of reducing drift of the electron beam 200 and irradiating the electron beam 200 to the desired position.

The features and advantages of the present invention may be summarized as follows.

Since the present invention includes a voltage supply device, which supplies the positive voltage to the electrostatic lens, the electron beam writing apparatus is capable of reducing drift of the electron beam due to the reflected electrons or the secondary electrons.

Since positive voltage is constantly applied to the electrostatic lens provided with electrodes aligned in an axial direction of the electron beam, the electron beam writing method is capable of reducing drift of the electron beam due to the reflected electrons or the secondary electrons.

The present invention is not limited to the above embodiment and may be modified in various forms without departing from the scope of the invention.

For example, in the above embodiment, the illumination lens 202, the projection lens 204, and the objective lens 207 are used as electromagnetic type lenses, but at least one of these lenses 202, 204, and 207 may be an electrostatic lens. In this case, the advantageous effect of the present invention can be obtained by applying positive voltage constantly to any of the electrostatic lenses within the electron optical column 198.

Further, in the above-mentioned execution of the present invention an electron beam was used, however, the present invention is not limited thereto and may utilize a different charged particle beam, for example an ion beam.

What is claimed is:

1. An electron beam writing apparatus comprising a control unit and a writing unit having an electron optical column and a writing chamber, comprising;
    a stage on which a sample is placed in the writing unit;
    an electron gun unit, which is disposed in the electron optical column, configured to emit an electron beam;
    an objective lens, which is disposed in an axial direction of the electron beam in the electron optical column below the electron gun unit, configured to focus the electron beam;
    a deflector disposed in the axial direction of the electron beam in the electron optical column below the objective lens, and configured to deflect the electron beam focused by the objective lens;
    an electrostatic lens positioned in an axial direction of the electron beam in the electron optical column below the deflector, and configured to correct a focal position of the electron beam deflected by the deflector;
    a shield plate, which is disposed between the stage and the electron optical column, configured to reduce reflected electrons or secondary electrons generated by irradiation to the sample with the electron beam from entering the electron optical column; and
    wherein the electrostatic lens is disposed immediately above the shield plate and immediately below the deflector and is constantly supplied only with positive voltage, from a voltage supply device, during writing patterns on the sample, and is configured to pull the reflected electrons or secondary electrons into the electron optical column such that an electron cloud is not formed.

2. The electron beam writing apparatus according to claim 1, wherein the electrostatic lens consists of three electrodes aligned in an axial direction of the electron beam in the electron optical column; and positive voltage is applied from the voltage supply device to the middle electrode.

3. The electron beam writing apparatus according to claim 1, wherein a positive voltage in a range between 0 V and 250 V is applied from the voltage supply device to the electrostatic lens.

4. The electron beam writing apparatus according to claim 3, wherein a positive voltage between 100 V and 200 V on average is applied from the voltage supply device to the electrostatic lens.

5. The electron beam writing apparatus according to claim 1, further comprising:
- a first aperture for shaping the electron beam emitted from the electron gun;
- a second aperture further shaping the electron beam that has passed through the first aperture;
- an illumination lens illuminating the first aperture with the electron beam; and
- a projection lens projecting the electron beam to the second aperture having passed through the first aperture
- wherein the illumination lens, the projection lens, and the objective lens are all electromagnetic type lenses.

6. An electron beam writing method in which a predetermined pattern is written on a sample placed on a stage by emitting an electron beam from an electron gun disposed in an electron optical column, comprising:
- focusing the electron beam using an objective lens disposed in an axial direction of the electron beam in the electron optical column below the electron gun
- deflecting the electron beam focused by the objective lens using a deflector disposed in the axial direction of the electron beam in the electron optical column below the objective lens;
- correcting a focal position of the electron beam deflected by the deflector using an electrostatic lens having electrodes aligned in an axial direction of the electron beam in the electron optical column below the deflector;
- reducing reflected electrons or secondary electrons generated by irradiation to the sample with the electron beam from entering the electron optical column using a shield plate, which is disposed between the stage and the electron optical column;
- applying a positive voltage constantly to the electrostatic lens,
- wherein the electrostatic lens is disposed immediately above the shield plate and immediately below the deflector and is constantly supplied only with positive voltage during writing patterns on the sample, whereby reflected electrons or secondary electrons are pulled into the electron optical column such that an electron cloud is not formed.

7. The electron beam writing method according to claim 6, wherein the electron beam that has been emitted from the electron gun to a first aperture is illuminated by a illumination lens;
- projecting the electron beam that has passed through the first aperture to a second aperture by a projection lens;
- said focusing comprising focusing the electron beam that has passed through the second aperture by the objective lens; and
- irradiating the electron beam that has passed through the objective lens on the sample through the electrostatic lens.

8. The electron beam writing method according to claim 7, wherein a positive voltage in a range between 0 V and 250 V is applied to the electrostatic lens.

9. The electron beam writing method according to claim 8, wherein a positive voltage between 100 V and 200 V on average is applied to the electrostatic lens.

* * * * *